United States Patent [19]

Mikoshiba et al.

[11] Patent Number: 4,516,049
[45] Date of Patent: May 7, 1985

[54] MULTI-LAYER ACOUSTIC SURFACE WAVE DEVICE HAVING MINIMAL DELAY TIME TEMPERATURE COEFFICIENT

[75] Inventors: Nobuo Mikoshiba, 2-30-18 Yagiyama-Honcho; Kazuo Tsubouchi, 38-151, Aza-Hitokitayama, Moniwa, both of Sendai-shi, Miyagi-ken, Japan; Kazuyoshi Sugai, Sendai, Japan

[73] Assignees: Nobuo Mikoshiba; Kazuo Tsubouchi, both of Sendai, Japan

[21] Appl. No.: 536,926

[22] Filed: Sep. 28, 1983

[30] Foreign Application Priority Data

Oct. 5, 1982 [JP] Japan .................. 57-175203

[51] Int. Cl.³ .............................................. H03H 9/42
[52] U.S. Cl. ........................... 310/313 A; 310/313 B; 333/155
[58] Field of Search .................... 310/313 A, 313 B; 333/154, 193, 196, 155

[56] References Cited

U.S. PATENT DOCUMENTS

| | | | |
|---|---|---|---|
| 3,956,647 | 5/1976 | Mitchell et al. | 310/313 A |
| 3,965,444 | 6/1976 | Willingham et al. | |
| 4,037,176 | 7/1977 | Ono et al. | 310/313 B |
| 4,038,615 | 7/1977 | Ishiyama et al. | 333/193 |
| 4,194,171 | 3/1980 | Jelks | 333/154 |
| 4,358,745 | 11/1982 | Keyes | 310/313 A |
| 4,393,321 | 7/1983 | Bagdasarian et al. | 310/313 B |

FOREIGN PATENT DOCUMENTS 1363519  8/1974  United Kingdom .

Primary Examiner—William H. Beha, Jr.
Assistant Examiner—D. L. Rebsch
Attorney, Agent, or Firm—Flynn, Thiel, Boutell & Tanis

[57] ABSTRACT

An acoustic surface wave device includes a substrate made of an elastic material, a multilayer structure disposed on a surface of the substrate and having a silicon dioxide layer and an aluminum nitride layer superimposed on each other, and electrodes having predetermined configurations formed on the multilayer structure. The main component of the elastic material is a silicon monocrystal, whose temperature coefficient of delay time for acoustic surface waves is positive, and the piezo-electric axis of the aluminum nitride is either perpendicular or parallel to the surface of the substrate, with a negative delay coefficient, counteracting that of the substrate.

22 Claims, 18 Drawing Figures

MULTI-LAYER ACOUSTIC SURFACE WAVE DEVICE HAVING MINIMAL DELAY TIME TEMPERATURE COEFFICIENT

FIELD OF THE INVENTION

This invention relates to allowed copending application Ser. No. 473,410, filed Mar. 9, 1983 for the same inventors, both applications for an acoustic surface wave device having a new structure with excellent characteristics.

BACKGROUND OF THE INVENTION

The following structures (substrates) each forming an acoustic surface wave device for processing different electric signals by utilizing acoustic surface waves, are already known.

(1) Structure consisting of only a substrate made of a piezoelectric substance (piezoelectric monocrystal substrate, piezoelectric ceramic substrate, etc.);

(2) Structure consisting of a non piezoelectric substrate and a piezoelectric layer formed thereon; and (3) Structure consisting of a semiconductor substrate and a piezoelectric layer formed thereon.

Among multilayer structures of the type mentioned in item 2, at present a structure consisting of a substrate made of sapphire or glass and a layer made of zinc oxide (ZnO) formed thereon by sputtering or another method is most widely utilized. However, this ZnO layer has the following disadvantages and therefore it is difficult to use in practice.

(1) Since a high quality layer is difficult to obtain, it is not possible to form a layer with a satisfactorily high reproducibility with respect to its piezoelectricity.

(2) Propagation loss of acoustic surface waves is high in the high frequency regions.

(3) Fluctuation in propagation characteristics of the acoustic surface waves is high.

(4) It is difficult to control the variation ratio in delay time ($\tau$) in dependence on the temperature for acoustic surface waves $(1/\tau) \cdot (\partial \tau / \partial T)$ (T: room temperature).

OBJECT OF THE INVENTION

An object of this invention is to eliminate these difficulties and to provide a new acoustic surface wave device, in particular using a silicon monocrystal substrate.

SUMMARY OF THE INVENTION

In order to achieve this object, this invention is characterized by utilization of an elastic structure which consists of an elastic substrate whose temperature coefficient in delay time for acoustic surface waves is positive, a silicon dioxide layer disposed thereon, and an aluminum nitride layer further superimposed on said silicon dioxide layer.

This invention will be explained in more detail referring to the drawings.

DETAILED DESCRIPTION OF PREFERRED EMBODIMENTS

Figure 1:
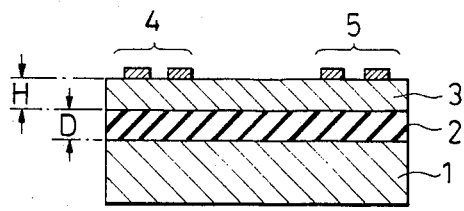
FIGS. 1 to 4 are cross-sectional views of 4 different acoustic surface wave devices according to this invention.

FIG. 1 is a cross-sectional view of an acoustic surface wave device according to an embodiment of this invention, in which: 1 denotes a silicon monocrystal substrate cut along a crystallographical surface equivalent to (111), (110) or (100); 2 represents a silicon dioxide layer ($SiO_2$) disposed on this silicon monocrystal substrate 1; and 3 represents an aluminum nitride layer which is so formed on this silicon dioxide layer 2 ($SiO_2$) that its piezo-electric axis (C axis or [0001] axis) is perpendicular or parallel to the silicon monocrystal substrate 1. 4 and 5 are electrodes for generating acoustic surface waves and for detecting them, respectively, both being disposed on the multilayer structure thus formed, each for example in the form of a comb-shaped electrode provided on the aluminum nitride layer 3. D represents the thickness of the silicon dioxide layer 2 and H denotes the thickness of the aluminum nitride layer 3.

Figure 5A:
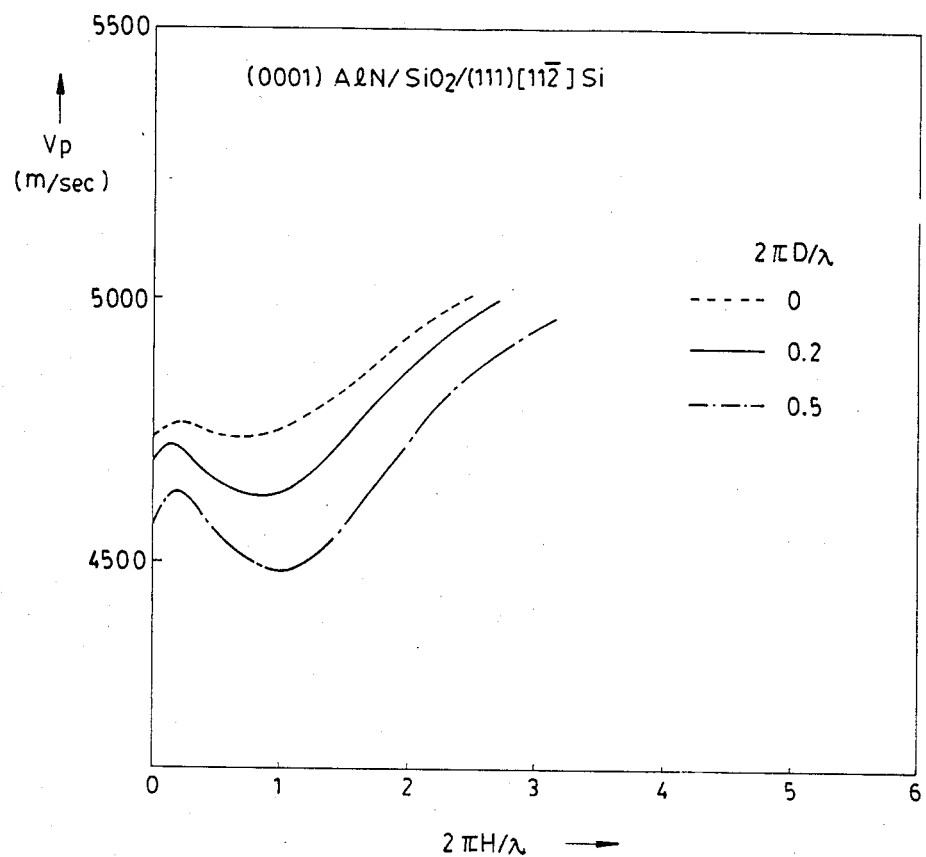
FIGS. 5(A) to 5(F), FIGS. 6(A) and 6(B), and FIGS. 7(A) to 7(F) are all diagrams representing results obtained by using acoustic surface wave devices according to this invention.
Figure 5:
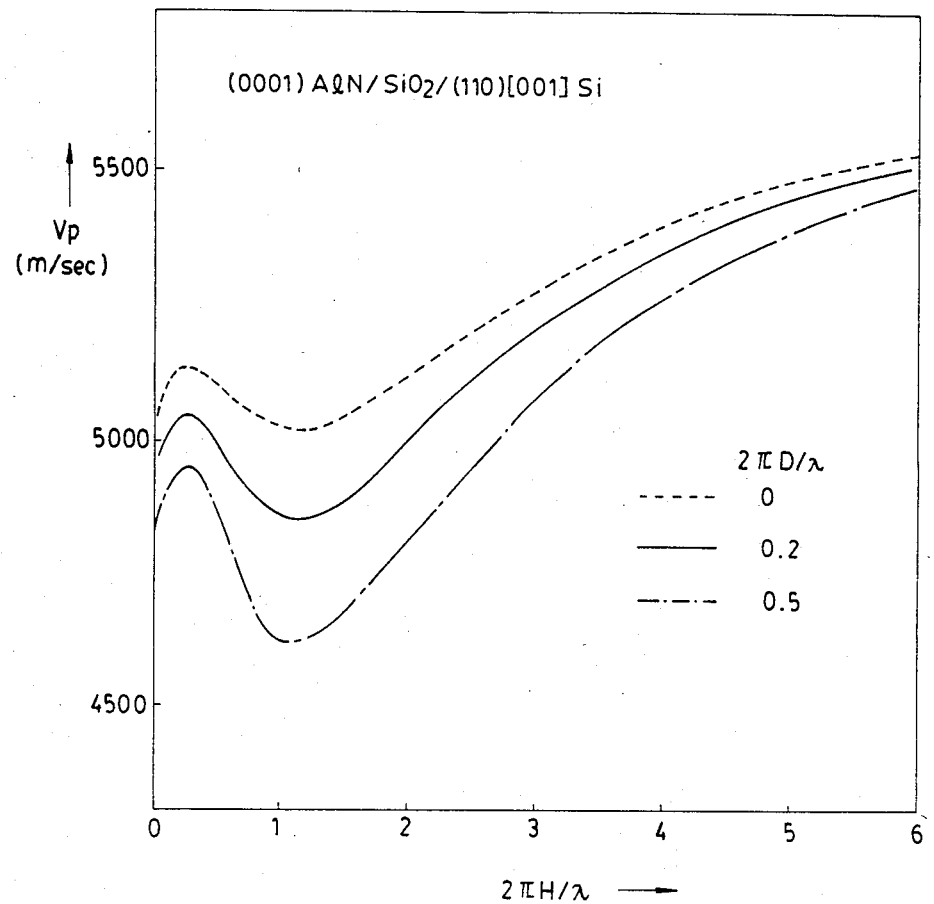
Figure 5:
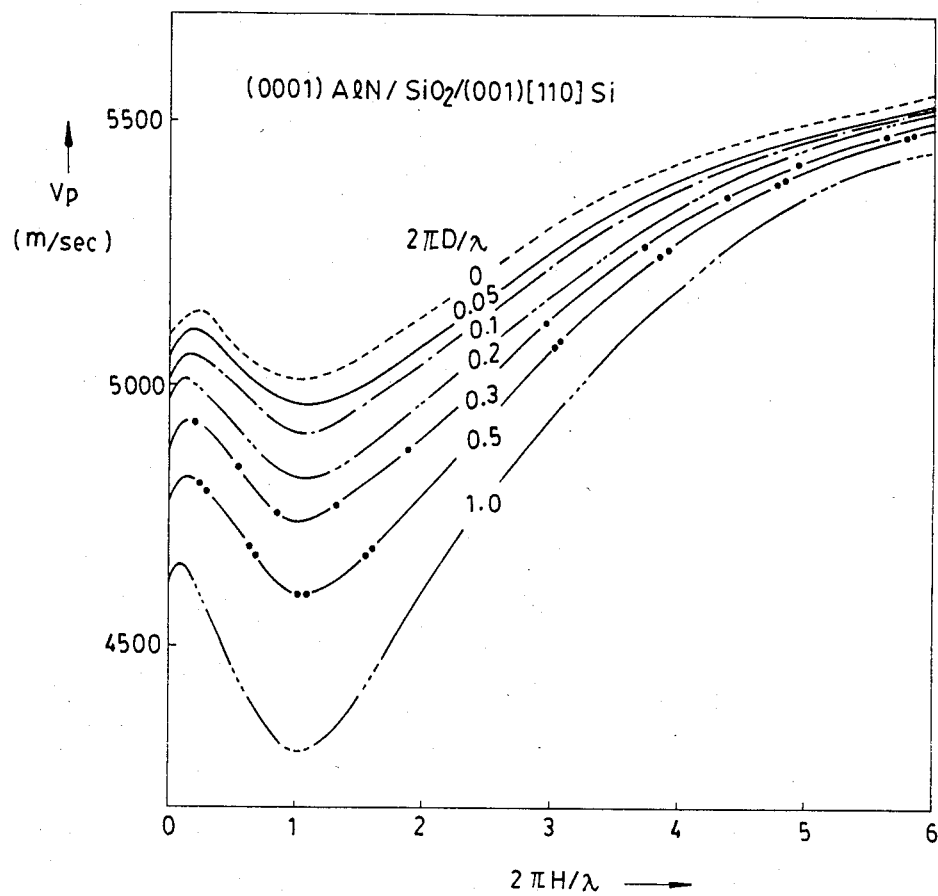

For an acoustic surface wave device thus constructed, when acoustic surface waves are excited (propagated) perpendicular to the direction of the piezo-electric axis of the aluminum dioxide layer 3, the velocity dispersion characteristics of acoustic surface waves shown in FIGS. 5(A), 5(B) and 5(C) have been obtained. In this figure, the abscissa represents the normalized thickness of the aluminum nitride layer 3 in $2\pi H/\lambda$ (where $\lambda$ denotes the wavelength of the acoustic surface wave) and the ordinate represents the phase velocity $V_p$ of the acoustic surface wave, where the parameter used is the normalized thickness $2\pi D/\lambda$ of the silicon layer 2.

The drawings show characteristics for the acoustic surface wave propagation along the direction equivalent to the [11$\bar{2}$] axis on a surface (111) of the silicon mono-crystal substrate 1, FIG. 5(A); for the acoustic surface wave propagation along the direction equivalent to the [001] axis on a surface (110) of the silicon mono-crystal substrate 1, FIG. 5(B); and for the acoustic surface wave propagation along the direction equivalent to the [110] axis on a surface (001) of the silicon monocrystal substrate 1, FIG. 5(C).

As it is apparent from the characteristic curves shown in FIGS. 5(A), 5(B) and 5(C), dispersion of the phase velocity $V_p$ is small. Furthermore, it is possible to obtain very large values for the phase velocity $V_p$.

Figure 6:
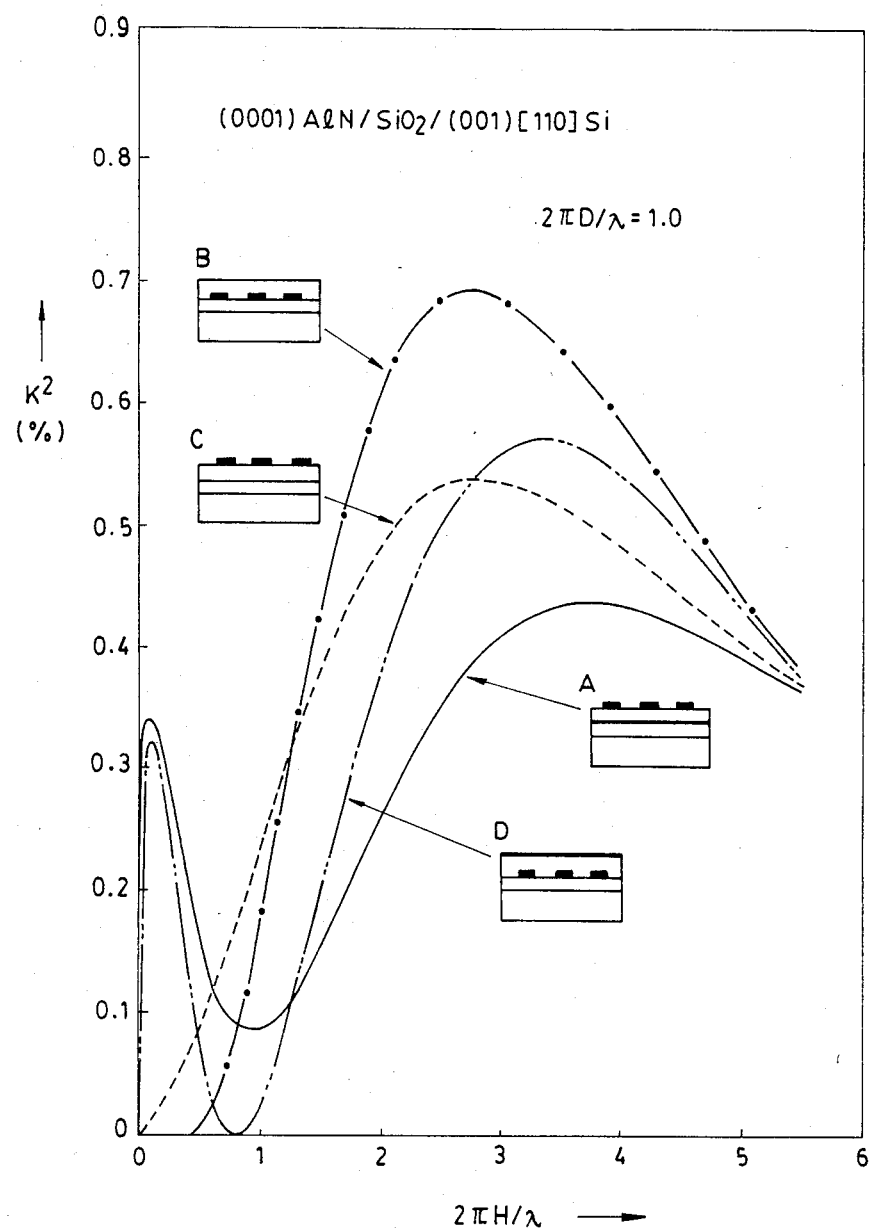
Figure 6:
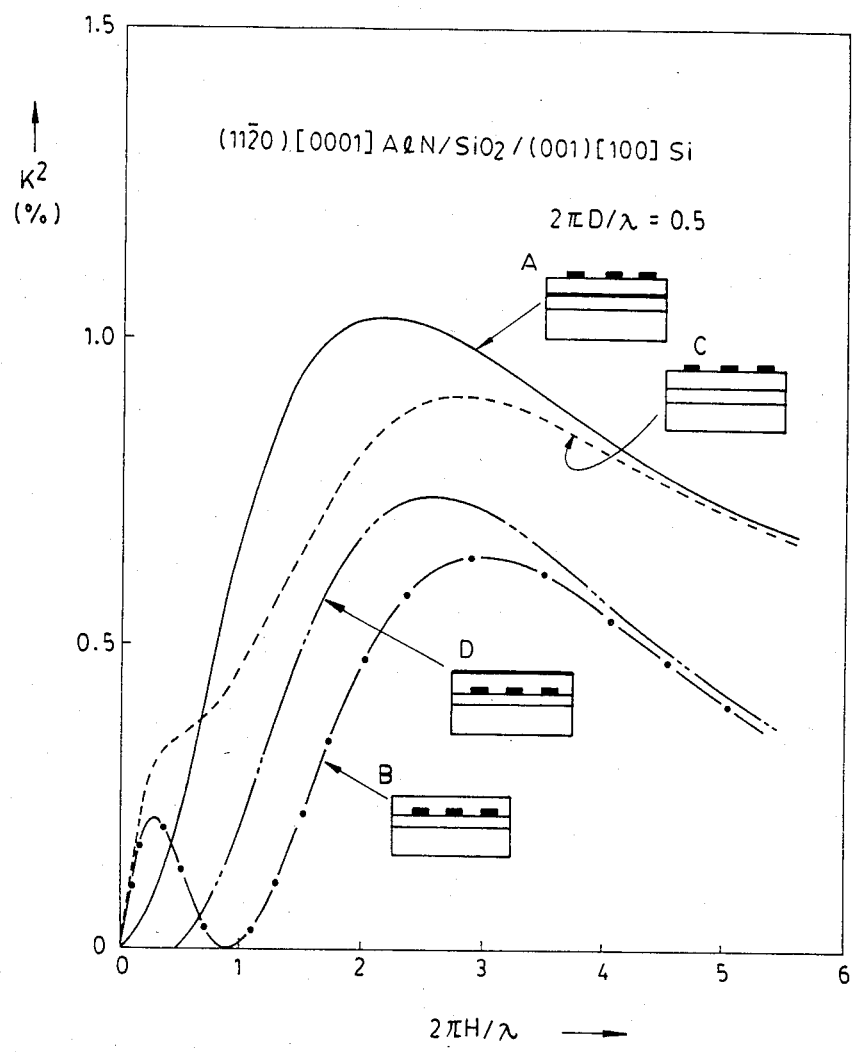

FIG. 6(A) shows characteristics curves of the electromechanical coupling coefficient obtained from the results shown previously, where the abscissa represents $2\pi H/\lambda$ and the ordinate the square $K^2$ of the electromechanical coupling coefficient K (shown as a percentage). The figure shows characteristics in the case where acoustic surface waves propagate along the direction equivalent to [110] on a surface (001) of the silicon mono-crystal substrate 1. The device A in this figure is that shown in FIG. 1. The curves in the figure show that, in general, it is possible to obtain values of $K^2$ which are sufficient to generate and detect acoustic surface waves and that the devices have good piezoelectric properties.

Figure 7:
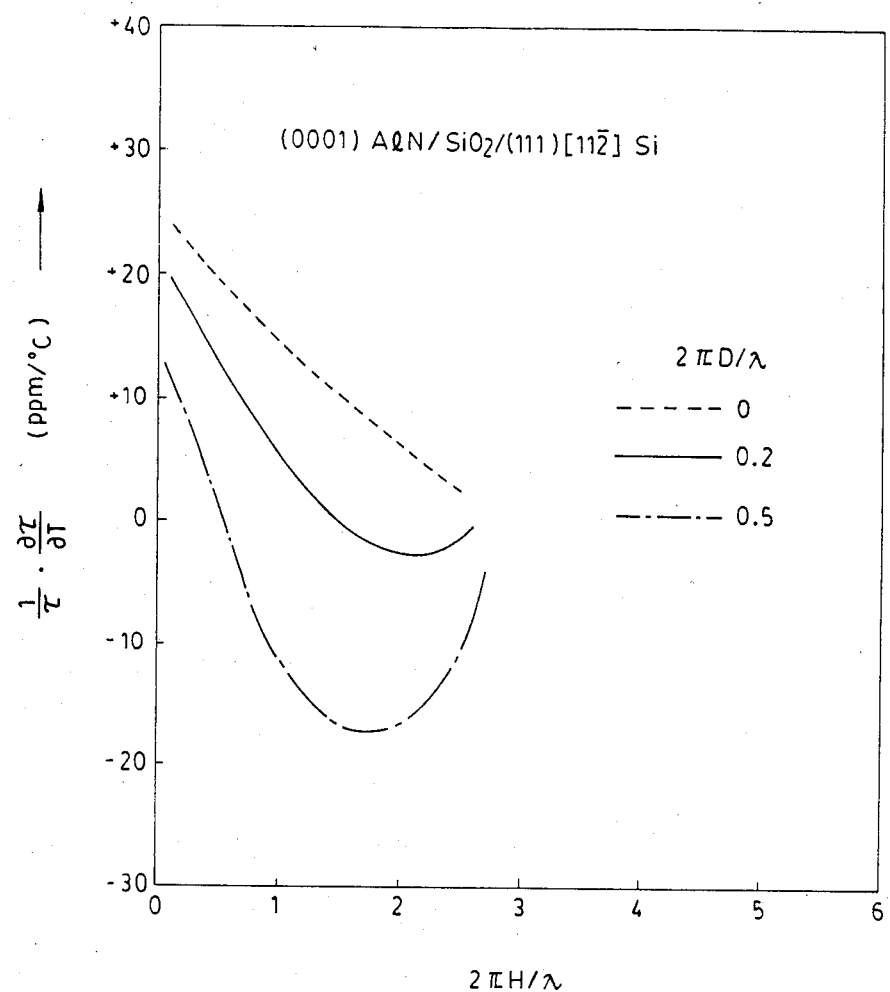
Figure 7B:
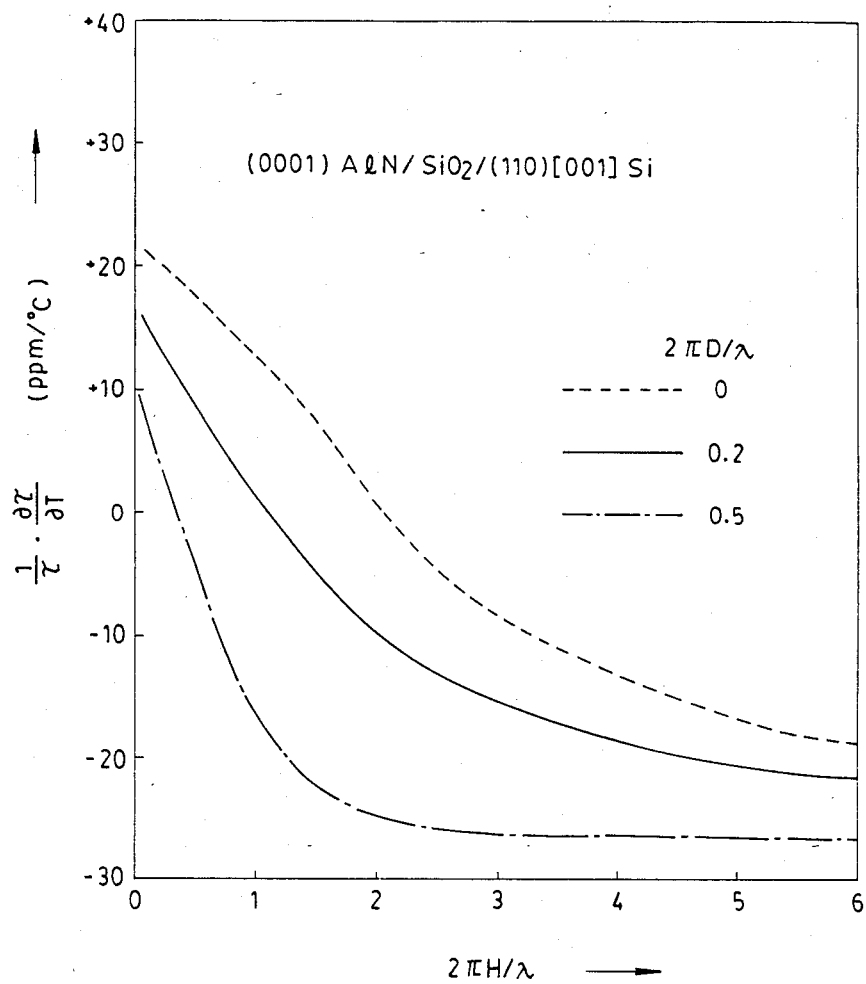
Figure 7C:
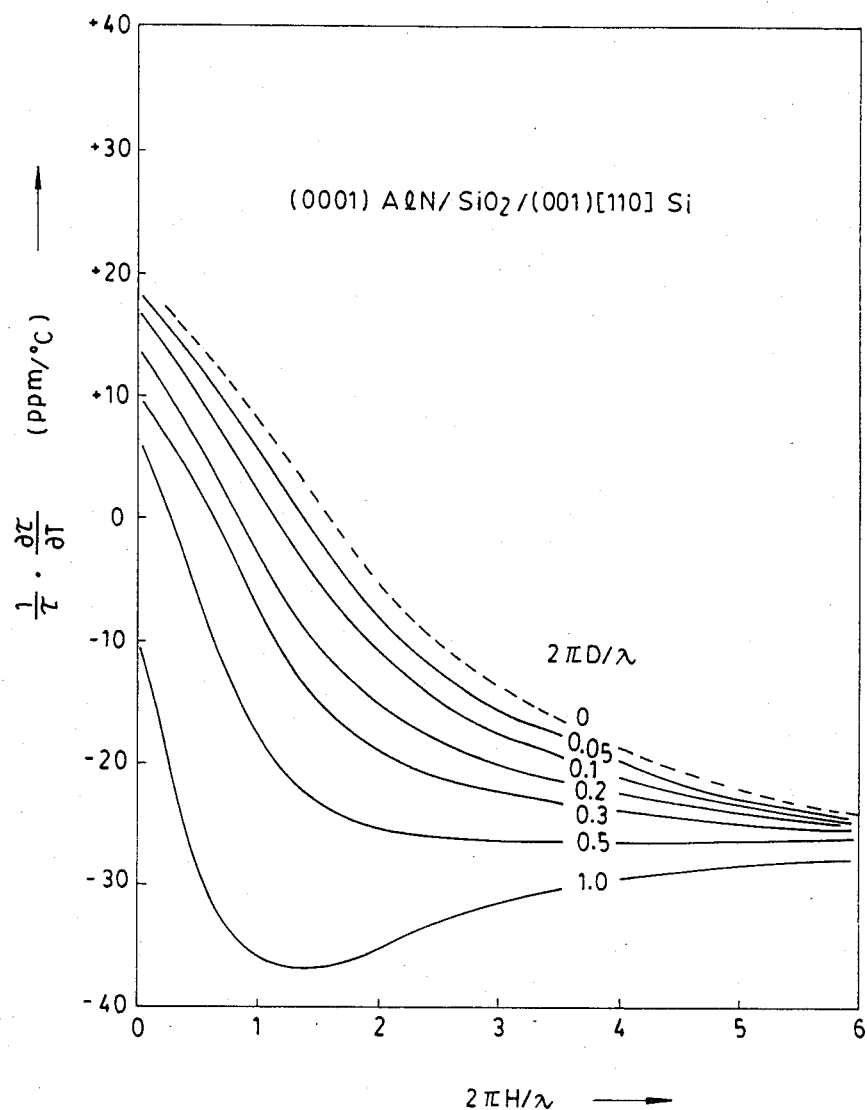

FIGS. 7(A), 7(B) and 7(C) show characteristic curves for the temperature coefficient of the delay time (TCD) for the acoustic surface waves obtained by using the devices discussed above, where the abscissa represents $2\pi H/\lambda$ and the ordinate the variation ratio in delay time ($\tau$) in dependence on the temperature $(1/\tau)\cdot(\partial\tau/\partial T)$ in ppm/°C.

In the drawing, FIGS. 7(A), 7(B) and 7(C) show characteristics for the acoustic surface wave propagation along the direction equivalent to the [11$\bar{2}$] axis on a surface (111) of the silicon monocrystal substrate 1, for the acoustic surface wave propagation along the direction equivalent to the [001] axis on a surface (110) of the silicon monocrystal substrate 1, and for the acoustic surface wave propagation along the direction equivalent to the [110] axis on a surface (001) of the silicon mono-crystal substrate 1, respectively. It should be noted here that, since the silicon monocrystal substrate 1 has a positive temperature coefficient in delay time, while the silicon dioxide layer 2 and the aluminum nitride layer 3 have negative temperature coefficients in delay time, resulting characteristics give values for which these coefficients compensate each other. It should also be noted that the temperature coefficients in delay time vary depending on the thickness D of the silicon dioxide layer 2 and the thickness H of the aluminum nitride layer 3. Consequently, by properly choosing these thicknesses D and H, it is possible to cause the composite temperature coefficient approach zero.

Figure 5D:
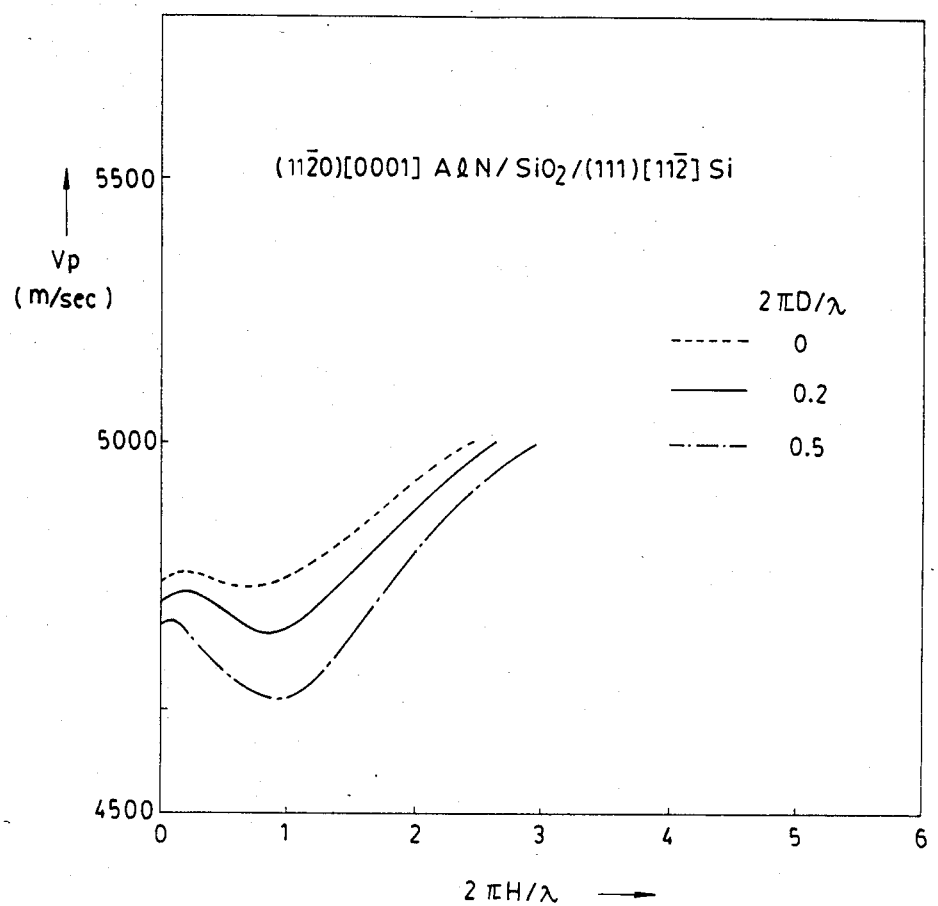
Figure 5:
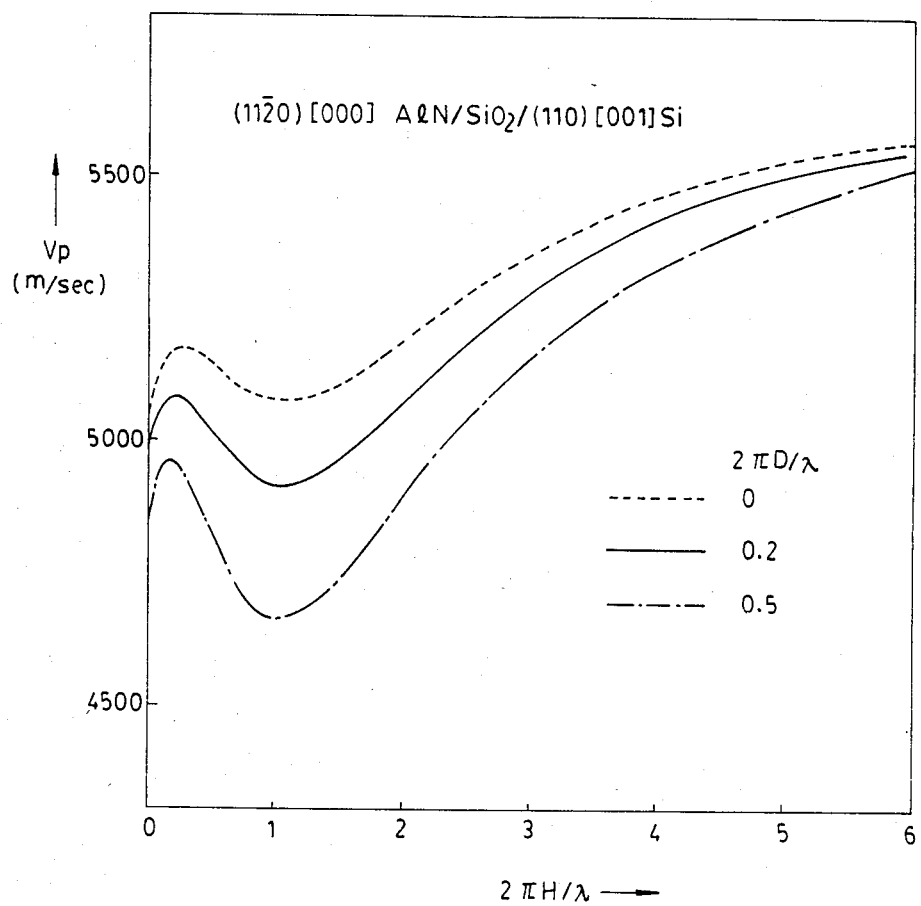
Figure 5F:
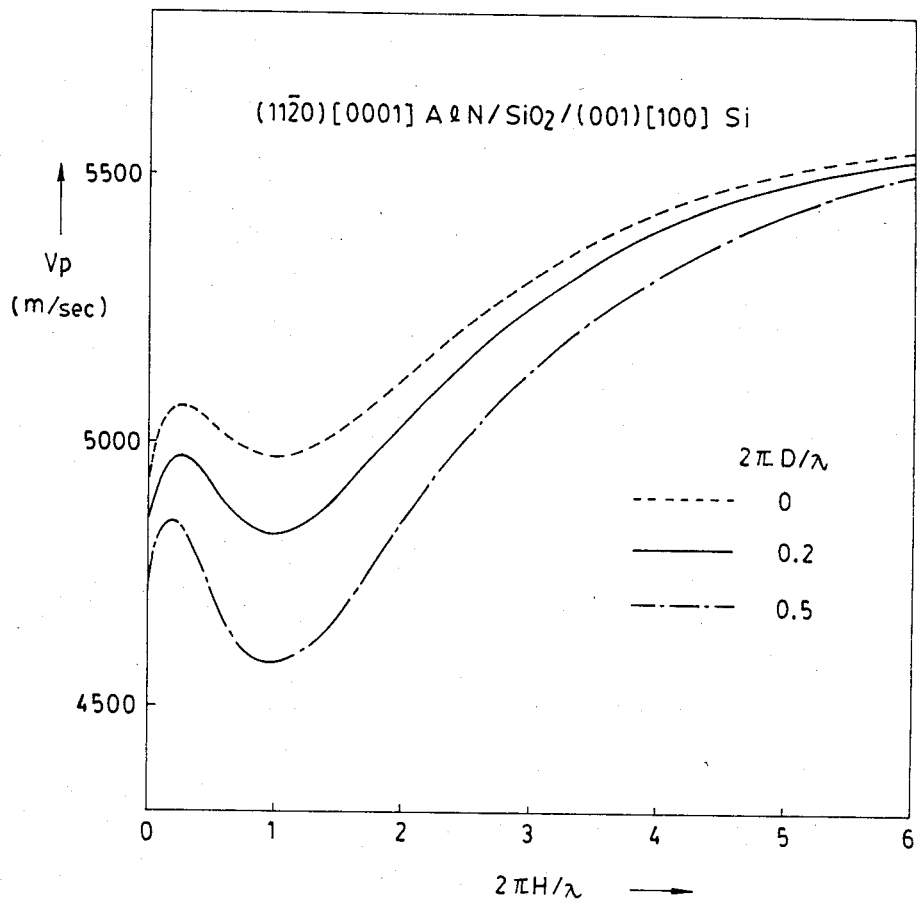

In the case where acoustic surface waves propagate parallel to the piezoelectric direction of the aluminum nitride layer 3, in contrast to the acoustic surface wave device whose structure is shown in FIG. 1, the characteristics of acoustic surface wave velocity dispersion shown in FIGS. 5(D), 5(E) and 5(F) have been obtained.

In the drawing, FIGS. 5(D), 5(E) and 5(F) respectively show characteristics for the acoustic surface wave propagation along the direction equivalent to the [11$\bar{2}$] axis on a surface (111) of the silicon monocrystal substrate 1, for the acoustic surface wave propagation along the direction equivalent to the [001] axis on a surface (110) and for the acoustic surface wave propagation along the direction equivalent to the [110] axis on a surface (001).

As is apparent from the characteristic curves shown in FIGS. 5(D), 5(E) and 5(F), dispersion of the phase velocity $V_p$ is small. Furthermore, it is possible to obtain very great values for the phase velocity $V_p$.

FIG. 6(B) shows characteristic curves representing the electromechanical coupling coefficients obtained in the case where acoustic surface waves propagate along the direction equivalent to the [100] axis on a surface (001) of the silicon mono-crystal substrate 1. The device A in this figure is that shown in FIG. 1. The curves in the figure show that, in general, it is possible to obtain values of $K^2$ which are sufficient to generate and detect acoustic surface waves and that the devices have good piezo-electric properties.

Figure 7D:
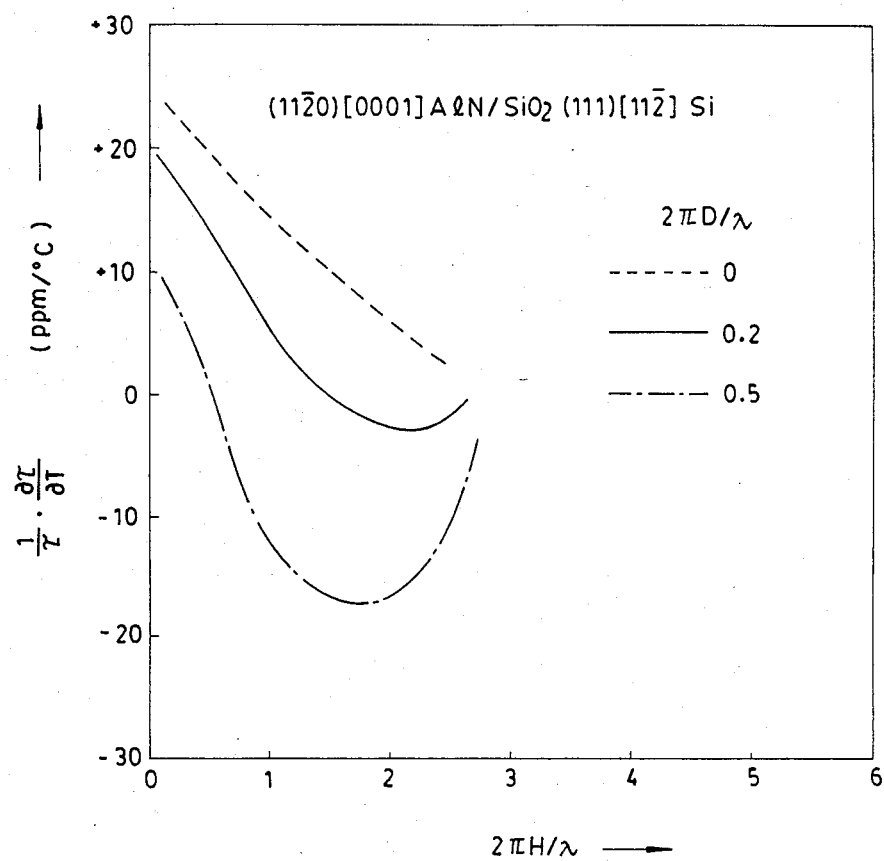
Figure 7:
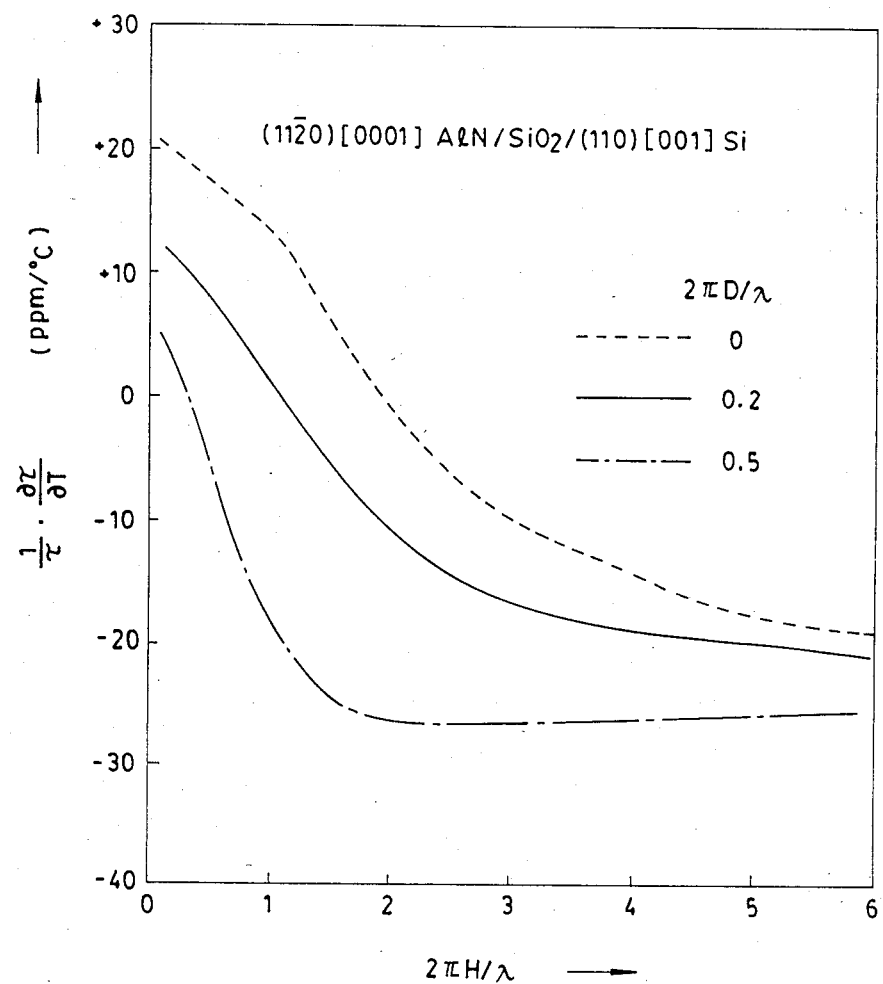
Figure 7:
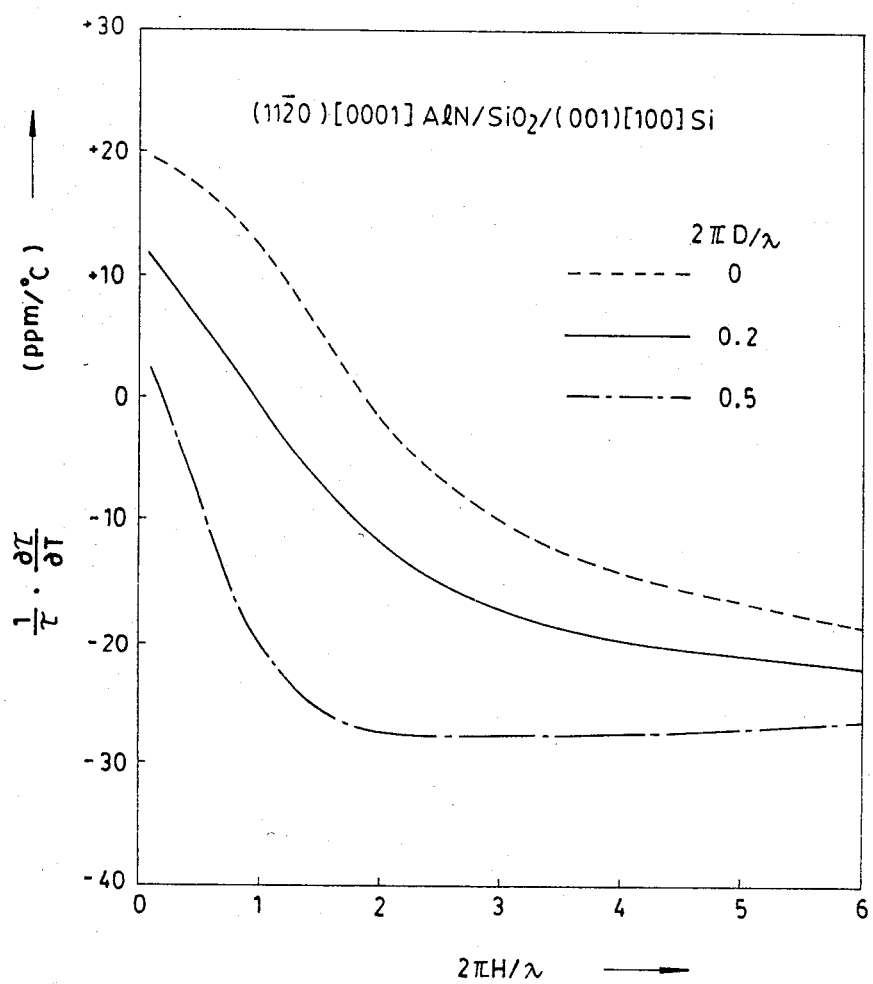

FIGS. 7(D), 7(E) and 7(F) show characteristic curves for the temperature coefficient of the delay time (TCD) for acoustic surface waves obtained by using these devices.

FIGS. 7(D), 7(E) and 7(F) respectively show characteristics for the acoustic surface wave propagation along the direction equivalent to the [11$\bar{2}$] axis on a surface (111) of the silicon mono-crystal substrate 1, for the acoustic surface wave propagation along the direction equivalent to the [001] axis on a surface (110) and for the acoustic surface wave propagation along the direction equivalent to the [110] axis on a surface (001).

As it is apparent in FIGS. 7(A) to 7(F), it is possible to obtain small variation ratios in delay time in dependence on the temperature by choosing the thickness D of the silicon dioxide layer 2 from a range defined by $0 < 2\pi D/\lambda < 1.0$ and by choosing the thickness H of the aluminum nitride layer 3 from a range defined by $0.1 < 2\pi H/\lambda < 3.0$. Furthermore, by properly choosing the crystallographical surface of the silicon mono-crystal substrate 1, the thickness D of the silicon dioxide layer 2 and the thickness H of the aluminum nitride layer 3, and by combining them suitably, it is possible to cause the temperature coefficient in delay time to approach zero.

Figure 2:
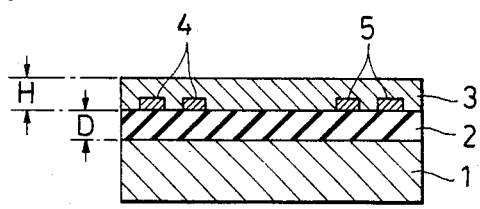
Figure 3:
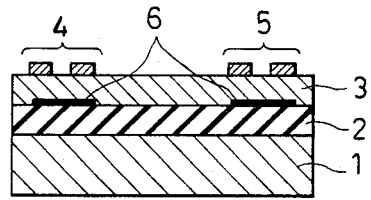
Figure 4:
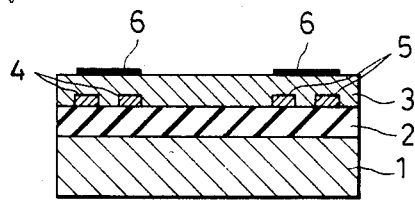

FIGS. 2 to 4 are cross-sectional views representing other embodiments according to this invention. FIG. 2 shows the structure of a device in which a silicon dioxide layer 2 is first formed on a silicon monocrystal substrate 1, an electrode for generating acoustic surface waves 4 and an electrode for detecting them 5, and an aluminum nitride layer 3 is then formed on the layer 2 and electrodes 4 and 5. FIG. 3 shows the structure of another device, in which a silicon dioxide layer is first formed on a silicon mono-crystal substrate 1, a pair of shielding electrodes are then formed 6 as second electrodes on the silicon dioxide layer 2, an aluminum nitride layer 3 is formed covering the silicon dioxide layer including the shielding electrodes, and finally an electrode for generating acoustic surface waves 4 and an electrode for detecting them 5 as first electrodes are formed on the surface of this aluminum nitride layer 3.

Further, FIG. 4 shows the structure of still another device, in which a silicon dioxide layer is first formed on a silicon monocrystal substrate 1, an electrode for generating acoustic surface waves 4 and an electrode for detecting them 5 as first electrodes are then formed on the surface of this silicon dioxide layer, an aluminum nitride layer 3 is formed on the silicon dioxide layer 2 and the first electrodes, and finally a pair of shielding electrodes 6 as second electrodes are formed on the surface of this aluminum nitride layer 3.

For the acoustic surface wave devices described above, in the case where acoustic surface waves propagate perpendicular to the piezoelectric direction of the aluminum nitride layer 3, the acoustic surface wave velocity dispersion characteristics as shown in FIGS. 5(A), 5(B) and 5(C) have been obtained. As is apparent from these characteristic curves, dispersion of the phase velocity $V_p$ is small. Furthermore, it is possible to obtain very great values for the phase velocity $V_p$.

On the other hand, based on these results, $K^2$ characteristics as shown in FIG. 6(A) have been obtained.

In this figure, the devices B, C and D correspond to those shown in FIGS. 2, 3 and 4, respectively. The curves in the figure show that, in general, it is possible to obtain values of $K^2$ which are sufficient to generate and detect acoustic surface waves and that the devices have good piezoelectric properties.

Using these devices, the characteristic curves for the temperature coefficient of the delay time (TCD) for the acoustic surface waves as shown in FIGS. 7(A), 7(B) and 7(C) have been obtained.

As is apparent from these characteristic curves, it is possible to cause variation ratios in delay time in dependence on the temperature to approach zero, by choosing adequately the thickness D of the silicon dioxide layer 2 and the thickness H of the aluminum nitride layer 3.

For the acoustic surface wave devices shown in FIGS. 2 to 4, in the case where acoustic surface waves propagate parallel to the piezoelectric direction of the aluminum nitride layer 3, the acoustic surface wave velocity dispersion characteristics shown in FIGS. 5(D), 5(E) and 5(F) have been obtained. As is apparent from these characteristic curves, dispersion of the phase velocity $V_p$ is small. Furthermore, it is possible to obtain very great values for the phase velocity $V_p$.

On the other hand, based on these results, $K^2$ characteristics as shown in FIG. 6(B) have been obtained. As is apparent from these figures, it is generally possible to obtain values of $K^2$ which are sufficient to generate and detect acoustic surface waves and the devices have good piezo-electric properties.

Using these devices, the characteristic curves for the temperature coefficient of the delay time (TCD) for the acoustic surface waves shown in FIGS. 7(D), 7(E) and 7(F) have been obtained. As is apparent from the characteristic curves shown in these figures, it is possible to obtain small variation ratios in delay time in dependence on the temperature by choosing a thickness D of the silicon dioxide layer 2 in a range defined by $0 < 2\pi D/\lambda < 1.0$ and a thickness H of the aluminum nitride layer 3 in a range defined by $0.1 < 2\pi H/\lambda < 3.0$. Furthermore, by properly choosing the crystallographical surface of the silicon monocrystal substrate 1, the thickness D of the silicon dioxide layer 2 and the thickness H of the aluminum nitride layer 3 and by combining them suitably, it is possible to cause the temperature coefficient in delay time to approach zero.

Since the aluminum nitride layer 3 used for the above-mentioned embodiments has a large band gap, which is about 6.2 eV, and since it is easy to obtain a layer having a high specific resistance, namely greater than $10^{16}\phi$ cm, it is a very good isolating layer. This aluminum nitride layer 3 can be formed easily by any known method, such as an MO-CVD method, a sputtering method, etc. Furthermore, since the aluminum nitride layer 3 has good reproducibility and uniformity, a small propagation loss can be maintained, especially in high frequency regions.

Since the aluminum nitride layer and the silicon dioxide layer have negative temperature coefficients in delay time for the acoustic surface waves, when they are formed on a silicon monocrystal substrate having a positive temperature coefficient in delay time the temperature coefficients in delay time compensate each other. Consequently it is possible to obtain stable characteristics with respect to temperature variations. Stability of the device with respect to temperature variations is one of the most important properties for narrow band signal processing devices, such as a resonator, an oscillator, etc. and thus these devices can be driven stably with respect to temperature variations by using the structures shown in the above-mentioned embodiments.

Furthermore, a high acoustic surface wave velocity can be obtained by using the structures shown in the above-mentioned embodiments according to this invention. Moreover, frequency dispersion of the acoustic surface wave velocity and the frequency variation ratio due to thickness variations can be kept small, and at the same time a good piezoelectric response can be obtained.

The substrate, on which the silicon dioxide layer and the aluminum nitride layer are formed, is not limited to silicon monocrystal, but any material can be used, provided that it has a negative temperature coefficient in delay time.

As is apparent from the above description, since the acoustic surface wave device according to this invention has an elastic structure in which a silicon dioxide layer is formed on an elastic substrate having a positive temperature coefficient in delay time for the acoustic surface waves, and an aluminum nitride layer is also deposited, both the layers having negative coefficients in delay time, the device has excellent characteristics.

As explained above, according to this invention, the following effects can be obtained.
1. Since the wavelength is long in high frequency regions owing to high acoustic surface wave velocities, fabrication of comb-shaped electrodes, etc. is easy.
2. Since fabrication of the device adjusted to a designed working frequency is easy due to small frequency variations due to variations which are in turn of the layer thickness, production yield is increased and production cost is reduced.
3. Variation ratios in delay time in dependence on the temperature for the acoustic surface wave device can be reduced to zero.
4. A high quality silicon dioxide layer and an aluminum nitride layer having a good isolation can be easily obtained by a well-known method such as an MO-CVD method, etc.

Moreover, the crystallographical surface and crystallographical orientation, along which acoustic surface waves propagate, of the substrate and the aluminum nitride layer are not limited to those shown in the embodiments, but they can be adequately selected. This is true also for the structure of the electrode for generating acoustic surface waves and the electrode for detecting them.

The embodiments of the invention in which an exclusive property or privilege is claimed are defined as follows:

1. Acoustic surface wave device comprising:
   a substrate made of an elastic material having a silicon monocrystal, said silicon monocrystal having a temperature coefficient of delay time for acoustic surface waves which is positive;
   a multilayer structure which is disposed on a surface of said substrate and includes a silicon dioxide layer and an aluminum nitride layer, said aluminum nitride layer being formed on said silicon dioxide layer so that a piezoelectric axis of said aluminum nitride layer has a predetermined orientation, said silicon dioxide layer and said aluminum nitride layer each having a temperature coefficient of delay time for acoustic surface waves which is negative, said negative temperature coefficients being substantially equal to and substantially counteracting the effects of said positive temperature coefficient of said substrate; and
   first electrode means for generating and second electrode means for detecting acoustic surface waves, said first and second electrode means being formed at predetermined positions on said multilayer structure.

2. Acoustic surface wave device according to claim 1, wherein said elastic material of said substrate is a silicon monocrystal.

3. Acoustic surface wave device according to claim 2, wherein said surface of said substrate is a crystallographical surface, said piezoelectric axis of said aluminum nitride layer is perpendicular to said surface, said silicon dioxide layer is disposed on said surface of said silicon monocrystal substrate, and said first electrode means propagates acoustic surface waves in a direction perpendicular to the direction of said piezoelectric axis of said aluminum nitride layer.

4. Acoustic surface wave device according to claim 3, wherein said crystallographical surface is equivalent to (111), and wherein said aluminum nitride layer has a thickness H which is in a range defined by $2\pi H/\lambda < 3.0$, where $\lambda$ denotes the wavelength of the acoustic surface waves.

5. Acoustic surface wave device according to claim 3, wherein said crystallographical surface is equivalent to (110), and wherein said aluminum nitride layer has a thickness H which is in a range defined by $2\pi H/\lambda < 6.0$, where $\lambda$ denotes the wavelength of the acoustic surface waves.

6. Acoustic surface wave device according to claim 3, wherein said crystallographical surface is equivalent to (100), and wherein said aluminum nitride layer has a thickness H which is in a range defined by $2\pi H/\lambda < 6.0$, where $\lambda$ denotes the wavelength of the acoustic surface waves.

7. Acoustic surface wave device according to claim 2, wherein said surface of said substrate is a crystallographical surface, said piezoelectric axis of said aluminum nitride layer is perpendicular to said surface, said silicon dioxide layer is disposed on said surface of said silicon monocrystal substrate, and said first electrode means propagates acoustic surface waves in a direction parallel to the direction of said piezoelectric axis of said aluminum nitride layer.

8. Acoustic surface wave device according to claim 7, wherein said crystallographical surface is equivalent to (111), and wherein said aluminum nitride layer has a thickness H which is in a range defined by $2\pi H/\lambda < 3.0$, where $\lambda$ denotes the wavelength of the acoustic surface waves.

9. Acoustic surface wave device according to claim 7, wherein said crystallographical surface is equivalent to (110), and wherein said aluminum nitride layer has a thickness H which is in a range defined by $2\pi H/\lambda < 6.0$, where $\lambda$ denotes the wavelength of the acoustic surface waves.

10. Acoustic surface wave device according to claim 7, wherein said crystallographical surface is equivalent to (100), and wherein said aluminum nitride layer has a thickness H which is in a range defined by $2\pi H/\lambda < 6.0$, where $\lambda$ denotes the wavelength of the acoustic surface waves.

11. Acoustic surface wave device according to claim 2, wherein said surface of said substrate is a crystallographical surface, said piezoelectric axis of said aluminum nitride layer is parallel to said surface, said silicon dioxide layer is disposed on said surface of said silicon monocrystal substrate, and said first electrode means propagates acoustic surface waves in a direction perpendicular to the direction of said piezoelectric axis of said aluminum nitride layer.

12. Acoustic surface wave device according to claim 11, wherein said crystallographical surface is equivalent to (111), and wherein said aluminum nitride layer has a thickness H which is in a range defined by $2\pi H/\lambda < 3.0$, where $\lambda$ denotes the wavelength of the acoustic surface waves.

13. Acoustic surface wave device according to claim 11, wherein said crystallographical surface is equivalent to (110), and wherein said aluminum nitride layer has a thickness H which is in a range defined by $2\pi H/\lambda < 6.0$, where $\lambda$ denotes the wavelength of the acoustic surface waves.

14. Acoustic surface wave device according to claim 11, wherein said crystallographical surface is equivalent to (100), and wherein said aluminum nitride layer has a thickness H which is in a range defined by $2\pi H/\lambda < 6.0$, where $\lambda$ denotes the wavelength of the acoustic surface waves.

15. Acoustic surface wave device according to claim 2, wherein said surface of said substrate is a crystallographical surface, said piezoelectric axis of said aluminum nitride layer is parallel to said surface, said silicon dioxide layer is disposed on said surface of said silicon monocrystal substrate, and said first electrode means propagates acoustic surface waves in a direction parallel to the direction of said piezoelectric axis of said aluminum nitride layer.

16. Acoustic surface wave device according to claim 15, wherein said crystallographical surface is equivalent to (111), and wherein said aluminum nitride layer has a thickness H which is in a range defined by $2\pi H/\lambda < 3.0$, where $\lambda$ denotes the wavelength of the acoustic surface waves.

17. Acoustic surface wave device according to claim 15, wherein said crystallographical surface is equivalent to (110), and wherein said aluminum nitride layer has a thickness H which is in a range defined by $2\pi H/\lambda < 6.0$, where $\lambda$ denotes the wavelength of the acoustic surface waves.

18. Acoustic surface wave device according to claim 15, wherein said crystallographical surface is equivalent to (100), and wherein said aluminum nitride layer has a thickness H which is in a range defined by $2\pi H/\lambda < 6.0$, where $\lambda$ denotes the wavelength of the acoustic surface waves.

19. Acoustic surface wave device according to claim 1, wherein said first and second electrode means are provided between said silicon dioxide and aluminum nitride layers.

20. Acoustic surface wave device according to claim 19, including first and second shielding electrodes which are provided on a side of said aluminum nitride layer opposite from and are respectively aligned with said first and second electrode means.

21. Acoustic surface wave device according to claim 1, wherein said first and second electrode means are provided on a side of said aluminum nitride layer remote from said silicon dioxide layer.

22. Acoustic surface wave device according to claim 21, including first and second shielding electrodes provided between said aluminum nitride and silicon dioxide layers and respectively aligned with said first and second electrode means.

* * * * *